United States Patent
Oppelt

(10) Patent No.: US 9,780,727 B2
(45) Date of Patent: Oct. 3, 2017

(54) FREQUENCY MODULATOR AND MAGNETIC RESONANCE TOMOGRAPHY SYSTEM WITH A FREQUENCY MODULATOR

(71) Applicant: Ralph Oppelt, Uttenreuth (DE)

(72) Inventor: Ralph Oppelt, Uttenreuth (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 13/934,183

(22) Filed: Jul. 2, 2013

(65) Prior Publication Data
US 2014/0009237 A1 Jan. 9, 2014

(30) Foreign Application Priority Data
Jul. 3, 2012 (DE) .................... 10 2012 211 502

(51) Int. Cl.
H03B 5/12 (2006.01)
H03C 3/09 (2006.01)
H03C 3/00 (2006.01)
H03C 3/22 (2006.01)
H03L 7/099 (2006.01)
G01R 33/36 (2006.01)

(52) U.S. Cl.
CPC ............... *H03C 3/00* (2013.01); *H03C 3/22* (2013.01); *G01R 33/36* (2013.01); *H03B 2200/004* (2013.01); *H03B 2201/011* (2013.01); *H03B 2201/0208* (2013.01); *H03L 7/099* (2013.01)

(58) Field of Classification Search
CPC ...... H03B 2201/0208; H03B 2200/004; H03B 2201/011; H03L 7/099; H03C 3/00; H03C 3/22; G01R 33/36

USPC ............. 331/16, 23, 34, 36 C, 177 R, 177 V
See application file for complete search history.

(56) References Cited

U.S. PATENT DOCUMENTS

| | | | |
|---|---|---|---|
| 4,959,625 A | 9/1990 | Kameoka et al. | |
| 6,292,065 B1* | 9/2001 | Friedman et al. | 331/117 R |
| 7,015,768 B1* | 3/2006 | Talwalkar | 331/177 V |
| 7,388,446 B2* | 6/2008 | Souetinov et al. | 331/177 V |
| 7,990,227 B2* | 8/2011 | Schechinger | H03L 7/099 331/117 FE |
| 8,134,418 B2* | 3/2012 | Jiang | 331/177 V |

(Continued)

FOREIGN PATENT DOCUMENTS

| | | |
|---|---|---|
| DE | 689 09 854 T2 | 2/1994 |
| EP | 1619788 A1 | 1/2006 |

OTHER PUBLICATIONS

German Office Action dated Mar. 13, 2013 for corresponding German Patent Application No. DE 10 2012 211 502.1 with English translation.

(Continued)

*Primary Examiner* — Richard Tan
(74) *Attorney, Agent, or Firm* — Lempia Summerfield Katz LLC

(57) ABSTRACT

A frequency modulator includes a first pair of diodes with two capacity diodes, and a second pair of diodes with two additional capacity diodes. The second pair of diodes is employed in parallel. The frequency modulator also includes a first modulator input for reception of a first modulation signal and a second modulator input for reception of a symmetrical second modulation signal. Both pairs of diodes are coupled to an oscillator unit.

21 Claims, 1 Drawing Sheet

(56) References Cited

U.S. PATENT DOCUMENTS

| | | | |
|---|---|---|---|
| 2006/0017513 A1* | 1/2006 | Geynet et al. | 331/36 C |
| 2007/0233324 A1* | 10/2007 | Albrecht | 700/280 |
| 2009/0039967 A1 | 2/2009 | Schechinger | |
| 2009/0115543 A1* | 5/2009 | Satoh | 331/177 V |
| 2010/0026404 A1* | 2/2010 | Hosoya | 331/177 V |
| 2011/0248787 A1 | 10/2011 | Jiang | |

OTHER PUBLICATIONS

M. Meinke et al., Taschenbuch der Hochfrequenztechnik, vol. 3, p. 1373, Abb. 57.2, 1968.

U. Tietze et al., Halbleiter-Schaltungstechnik, vol. 9, Fig. 7.18, p. 140, 1989.

Chinese office Action for related Chinese Application No. 201310265528.7 dated May 4, 2016, with English Translation.

\* cited by examiner

FREQUENCY MODULATOR AND MAGNETIC RESONANCE TOMOGRAPHY SYSTEM WITH A FREQUENCY MODULATOR

This application claims the benefit of DE 10 2012 211 502.1, filed on Jul. 3, 2012, which is hereby incorporated by reference.

BACKGROUND

The present embodiments relate to a frequency modulator for provision of a frequency-modulated communication signal.

FIG. 1 shows a frequency modulator 1. The frequency modulator 1 has a modulator input 2 to which an unbalanced-to-earth or ground modulation source 3 for the provision of a modulation signal UM is connected. The modulation signal UM is an alternating signal (e.g., an alternating voltage). The modulation signal UM may also be a direct voltage in certain cases. The modulator input 2 is coupled via a resistor 4 to a node 5, to which two capacity elements 6, 7 of a capacitive element pair are connected. Both capacity elements 6, 7 are configured as capacity diodes in the example illustrated in FIG. 1 but may also, for example, be controllable capacitors. Alternatively, one of the capacity elements 6, 7 may be a capacity diode, while the other capacity element is a simple capacitor. The capacity diodes 6, 7 are connected to each other reverse-connected so that the respective cathodes are directly connected to the node 5. The anode of the capacity diode 7 is directly connected to a reference potential 8, while the anode of the capacity diode 6 is coupled to a resonator of an oscillator unit 10. The anode of the capacity diode 6 may be connected to the reference potential 8 via a coil of the resonator. Alternatively, if a quartz resonator is used instead of an LC resonator, a connection, in parallel to the quartz, of the anode of the capacity diode 6 to the reference potential 8 is sufficient (e.g., via a resistor connected in parallel to the quartz). The oscillator unit 10 together with the capacity diodes 6, 7, for example, form a voltage-controlled oscillator (VCO). The oscillator unit 10 is connected to the reference potential 8 and has an oscillator output 11 that is coupled to a modulator output 12. A frequency-modulated communication signal UK is provided at the oscillator output 11 and therefore at the modulator output 12.

The oscillator unit 10 may include an oscillator circuit that, for example, may have an oscillator and an oscillating circuit such as, for example, an LC-oscillating circuit, a quartz-oscillating circuit or the like.

In the absence of the modulation signal UM, a bias voltage is applied to the modulator input 2 of, for example, 2V (e.g., with regard to the reference potential 8). Thus, the two capacity diodes 6, 7 are operated in a reverse direction because a positive voltage drops between the respective cathode and the assigned anode. In the absence of a modulation signal UM, the frequency of the communication signal UK is therefore constant. If the bias voltage at the modulator input 2 overlaps the modulation signal UM, for example, such that at the modulator input 2, a sinusoidal signal is provided as a modulation signal with an amplitude of, for example, 1V, and consequently, a total alternating voltage of 1V to 3V is provided, the capacities of the capacity diodes 6, 7, and consequently, the oscillation frequency of the entire VCO alter. According to the variable frequency of an alternating voltage US at the oscillator unit 10, the same unit 10 then produces the communication signal UK. The frequency of the communication signal UK is varied analogously to the modulation signal UM. The frequency modulation of the communication signal UK is thus specified by the modulation signal UM that is produced with the aid of the modulation source 3.

SUMMARY AND DESCRIPTION

The scope of the present invention is defined solely by the appended claims and is not affected to any degree by the statements within this summary.

Although the frequency modulator 1 of FIG. 1 represents a DC-capable modulator, the frequency modulator 1 also has certain disadvantages. In the frequency modulator 1 of FIG. 1, common mode interference in the modulation path may not be suppressed. If, for example, there are interference voltages or currents present that are coupled into the line between the modulation source 3 and the node 5 or beforehand to the modulation source 3, this interference voltage overlaps the modulation signal and results in undesired modulation of the communication signal UK.

An exemplary solution is provided by frequency modulators in which a balun transformer is connected upstream of the modulator input, as is proposed, for example, in M. Meinke, F. W. Gundlach, "Taschenbuch der Hochfrequenztechnik [Manual of High-Frequency Technology]," 3rd Ed., 1968, FIG. 57.2, p. 1373. Such a frequency modulator is naturally not DC-capable and may not therefore produce any static or quasi-static frequency offset for each modulation. Such a frequency offset may, for example, be provided if amplitude-compressed signals are to be transmitted without the loss of information. In addition, the use of a balun transformer proves to be detrimental, for example, in the case of magnetic resonance tomography systems (e.g., if the modulator is operated in a relatively strong magnetic field). No iron or ferrite cores, for example, may be used.

Current mirrors that may be connected upstream of the modulator input may provide a further remedy. Such a current mirror is, for example, to be taken as known from U. Tietze, Ch. Schenk, "Halbleiterschaltungstechnik [Semiconductor Technology]," 9th Ed., FIG. 7.18, p. 140. Such a circuit is relatively complex and also uses additional active components with associated disadvantages (e.g., with regard to power consumption).

The present embodiments may obviate one or more of the drawbacks or limitations in the related art. For example, a way of being able to suppress common mode interference in a frequency modulator is provided.

In one embodiment, in addition to the first modulator input, the frequency modulator also includes a second modulator input for reception of a second modulation signal symmetrical (e.g., balanced-to-earth or balanced-to-ground) to the first modulation signal and a second pair of elements with two capacity elements serially connected to each other in parallel to the first capacitive pair of elements. A second node between the capacity elements of the second pair of elements is connected to the second modulator input (e.g., via a resistor) so that the second modulation signal may be provided at the second node.

In one embodiment, the frequency modulator is therefore configured such that, in parallel to the first capacitive pair of elements, a second capacitive pair of elements including two capacity elements connected in series is provided. The two capacity elements are coupled to a second modulator input on which a second modulation signal symmetrical to the first modulation signal is provided. The frequency modulator may thus be operated with a symmetrical (e.g., balancedto-earth) modulation source, and two symmetrical signal paths may thus be provided between the modulation source and the oscillator. This enables reliable and efficient suppression of common mode interference, as a result of which faulty frequency modulation may be prevented. There is therefore no need to use an additional balun transformer or a current mirror with the associated disadvantages with regard to the dissipation rate. According to one or more of the present embodiments, a DC-capable frequency modulator is provided in which the common mode interference is suppressed with minimum effort.

In one embodiment, at least one of the capacity elements of the first pair of elements and/or at least one of the capacity elements of the second pair of elements is formed by a capacity diode. Such capacity diodes may be easily controlled with the aid of the applied reverse voltage.

In one embodiment, both capacity elements of the first pair of elements are formed by a capacity diode. The capacity diodes of the first pair of elements are reverse-connected to each other. In one embodiment, both the capacity elements of the second pair of elements may be formed by respective capacity diodes that are connected to each other reverse-connected and are connected to the oscillator unit with reverse polarity compared to the capacity diodes of the first pair of elements. In this way, a parallel circuit is obtained for the oscillation frequency from two separate pairs of diodes that are coupled to the oscillator unit and thus influence the oscillation frequency of the whole oscillator circuit.

In one embodiment, the capacity elements of the first and of the second pair of elements are components of the same kind (e.g., capacity diodes of the same kind or identical diodes). Thus, the symmetry to be provided is enabled. The expense with regard to the used components is minimal.

In one embodiment, the first pair of elements is coupled via at least one coupling capacitor to the second pair of elements in the frequency band of the oscillator unit. For example, two such coupling capacitors are provided (e.g., a first coupling capacitor and, hence on the side of the reference potential, a second coupling capacitor). The at least one coupling capacitor may be selected such that the at least one coupling capacitor represents a high-frequency short circuit, so that for the oscillation frequency of the oscillator unit of the at least one coupling capacitor, both pairs of elements short-circuit with each other, and with regard to a bias voltage, both pairs of elements are electrically separated from each other. In one embodiment, there is a relationship such that the capacity of at least one coupling capacitor is significantly greater than the maximum capacity of the capacity diodes in operation. By using such a coupling capacitor, both pairs of elements may therefore be reliably electrically separated from each other with regard to the bias voltage.

The frequency modulator may have a supply device with which a bias voltage is provided at the individual capacity elements of the first pair of elements and/or at the individual capacity elements of the second pair of elements. The capacity of the respective capacity elements in controllable capacity elements may thus be selected with minimum effort. If the capacity elements are configured as capacity diodes, then the diodes may be operated by applying a bias voltage in the reverse direction.

In one embodiment, the capacity elements of the second pair of elements are configured as capacity diodes that are connected to the second node and, as a result, to the second modulator input via anodes. With the aid of the supply device, an electric bias potential (e.g., with regard to the reference potential) may be provided at the cathodes of the capacity diodes. In addition, the supply device may supply an electrical input potential (e.g., with regard to the reference potential) at the first and the second modulator input. This provides that at all the capacity diodes, a bias voltage drops between the respective cathode and the respective anode, and all the capacity diodes are operated in the reverse direction.

In one embodiment, the bias potential at the cathodes of the capacity diode of the second pair of elements is twice as high as the input potential at the modulator inputs. Thus, all the capacity diodes with the same bias voltage are impinged in the reverse direction, and the symmetry is provided. In addition, as linear a working range as possible of the diode characteristic may therefore be selected, and consequently, a linear range of the correlation between the frequency variation and the modulation voltage variation at the capacity diodes may be provided.

Modulation signals may be alternating signals or alternating voltages that are balanced to earth or ground to each other or are symmetrical with regard to the reference potential (e.g., mass). These modulation signals may have a frequency of 0 Hz up to a predetermined maximum frequency value, for example, of up to 500 kHz. In borderline cases, the modulation signals may therefore also be direct voltages that are superimposed on the respective bias voltage or the respective input potential at the modulator inputs. By superimposing the modulation signals with the input potentials, signals that are symmetrical with regard to the input potential are provided at the modulator inputs.

A magnetic resonance tomography system with one embodiment of a frequency modulator is also provided. The embodiments presented with reference to the modulator and the corresponding advantages apply accordingly to the magnetic resonance tomography system.

Additional features emerge from the claims, the figures and the description of figures. All the aforementioned features and combinations of features specified in the description and the features and combinations of features shown in the description of figures and/or in the figures alone may be used not only in the respective combination specified but also in other combinations as well as in isolation.

DETAILED DESCRIPTION

Figure 1:
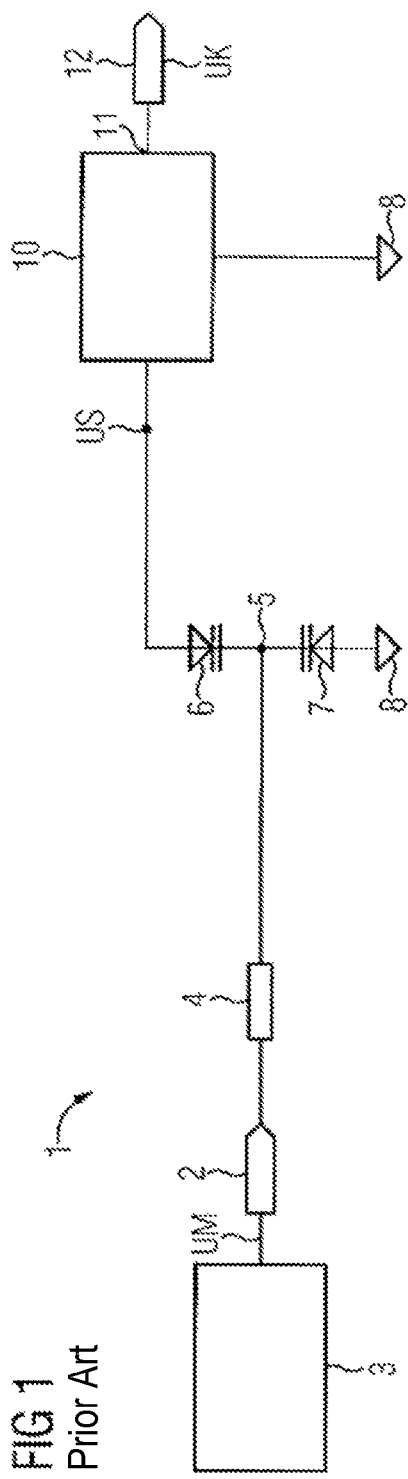
FIG. 1 is a schematic diagram of a frequency modulator in accordance with the prior art.

In the figures, the same elements or elements with the same functions are given the same reference characters.

Figure 2:
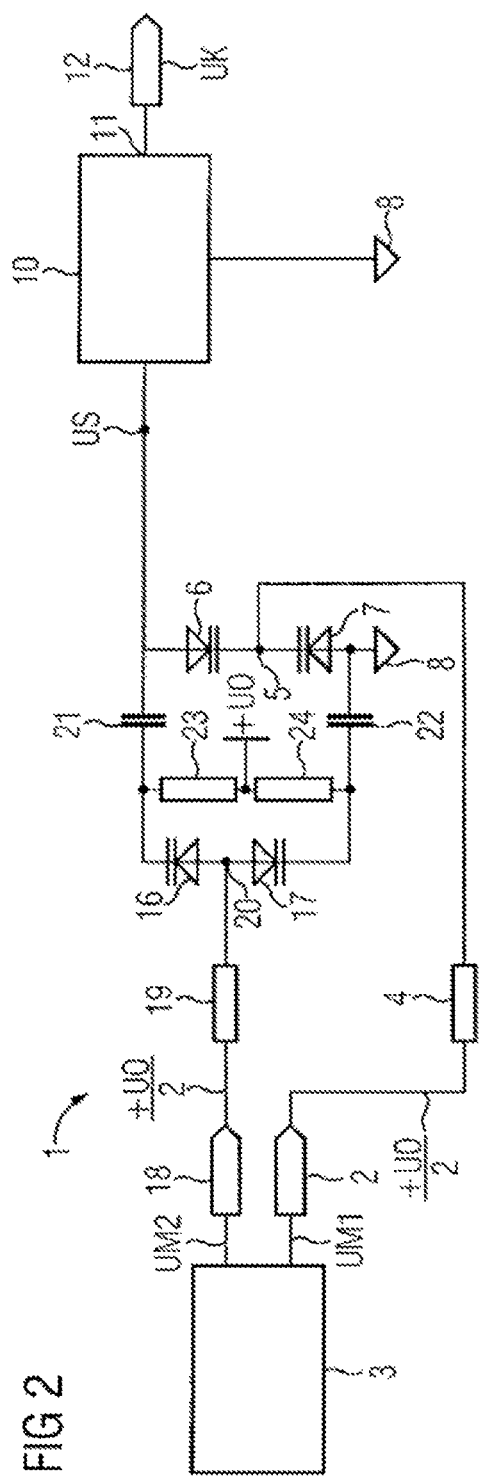
FIG. 2 shows one embodiment of a frequency modulator.

Compared to the frequency modulator 1 according to FIG. 1, the frequency modulator 1 according to an embodiment, according to FIG. 2 also has a second capacitive pair of elements with two capacity elements 16, 17 (e.g., a pair of diodes with a first and a second capacity diode 16, 17) that are reverse-connected to each other and overall are connected for the oscillation frequency in parallel to the first pair of diodes 6, 7. In addition, the frequency modulator 1 also has a second modulator input 18. The modulation source 3 is configured for provision of two balanced-to-earth (e.g., with regard to the reference potential 8) symmetrical modulation signals UM1, UM2. The second modulator input 18 is coupled via a resistor 19 to a second node 20 that is located between the two capacity diodes 16, 17 of the second pair of diodes. The second node 20 is directly connected to respective anodes of the capacity diodes 16, 17.

A cathode of the capacity diode 16 is coupled via a first coupling capacitor 21 to the anode of the capacity diode 6, and a cathode of the capacity diode 17 is coupled via a second coupling capacitor 22 to the reference potential 8 and therefore also to the anode of the capacity diode 7. Via respective resistors 23, 24, an electric bias potential of +U0 (e.g., 4V) is applied to the cathodes of the capacity diodes 16, 17 of the second pair of diodes with the aid of a corresponding supply device.

Both symmetrical modulator inputs 2, 18 are constantly biased with an electric input potential of U0/2 so that, for example, U0/2=2V.

The bias potential U0 and the input potential U0/2 result in all the capacity diodes 6, 7, 16, 17 with the same bias voltage of U0/2 being biased in the reverse direction. The symmetry is therefore provided. The capacity diodes 6, 7, 16, 17 may be operated in the reverse direction by appropriate selection of U0 and U0/2 at an operating point in as approximately linear a range of the overall non-linear diode characteristic as possible.

The coupling capacitors 21, 22 have a capacity significantly greater than the maximum capacity of the capacity diodes 6, 7, 16, 17. Both the coupling capacitors 21, 22 therefore represent a high-frequency short circuit. In contrast, resistor values of the resistors 4, 19, 23, 24 are selected such that the resistor values constitute a high-frequency idle state. For the resistors 4, 19, 23, 24, the following applies: Rv>>1/ωCmin), where Rv represents the resistor value of the resistors 4, 19, 23, 24, Cmin represents the minimum capacity of the capacity diodes 6, 7, 16, 17, and ω represents the smallest circular frequency of the oscillator unit 10 per modulation.

Both the modulator inputs 2, 18 are thus constantly biased with the input potential of U0/2. In the absence of modulation signals UM1, UM2, the input potential of U0/2 (e.g., 2V) consequently lies on the modulator inputs 2, 18, respectively. If the balanced-to-earth modulation signals UM1, UM2 are provided by the modulation source 3, then the modulation signals UM1, UM2 are superimposed on the input potential of U0/2. Because both the modulation signals UM1, UM2 are balanced-to-earth signals, at the nodes 5, 20, respective signals that are symmetrical to each other with regard to the bias voltage of U0/2 are obtained. Because the bias potential of U0 is provided at the cathodes of the capacity diodes 16, 17, the capacity diodes 16, 17 are operated in the reverse direction. Because the anodes of the capacity diodes 6, 7 are located on the reference potential 8, the capacity diodes 6, 7 are also operated in the reverse direction.

In the absence of modulation signals UM1, UM2, the input potential U0/2 lies at the first and the second modulator input 2, 18, respectively, so that the frequency of the communication signal UK remains constant. If the respective balanced-to-earth modulator signals UM1, UM2 are now superimposed on the input potential U0/2 at the modulator inputs 2, 18, respective voltages that are symmetrical to each other with regard to the potential U0/2 are obtained both at the node 5 and at the node 20. If U0, for example, equals 4V and if the amplitude of the modulation voltage superimposed on U0/2 is 1V, for example, then the voltages at the node 5 vary, for example, between 1V and 3V, the voltages at the node 20, vice versa, vary from 3V to 1V. Thus, the capacities of the capacity diodes 6, 7 and 16, 17 and therefore also the frequency of the voltage US at the port of the oscillator unit 10 vary in the same way. The oscillator 10 generates the communication signal UK with corresponding variable frequency.

To bias the two modulator inputs 2, 18 to the input potential of U0/2 and to provide the bias potential U0, the frequency modulator 1 includes a corresponding supply device that, for example, may also be integrated into the modulation source 3 or may be provided as a separate source.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A frequency modulator for providing a communication signal that is frequency-modulated, the frequency modulator comprising:

a first modulator input for a first modulation signal for specification of a frequency modulation for the communication signal;

a second modulator input for a second modulation signal symmetrical to the first modulation signal;

an oscillator unit coupled with the first modulator input, the oscillator unit being configured, dependent on the first modulation signal and the second modulation signal, to generate the frequency-modulated communication signal at an oscillator output;

a first capacitive pair of elements with two serially connected capacity elements, a first element of the first capacitive pair of elements being coupled to the oscillator unit and a second element of the first capacitive pair of elements being coupled to a reference potential, wherein a first node between the two serially connected capacity elements is coupled to the first modulator input so that the first modulation signal is suppliable at the first node; and a second capacitive pair of elements connected in parallel to the first capacitive pair of elements, the second capacitive pair of elements comprising two capacity elements serially connected to each other, a third element of the second capacitive pair of elements being coupled to the oscillator unit via a first coupling capacitor and a fourth element of the second capacitive pair of elements being coupled to the reference potential via a second coupling capacitor, wherein a second node between the two capacity elements of the second capacitive pair of elements is coupled to the second modulator input, so that the second modulation signal is suppliable at the second node, the first coupling capacitor between the third element of the second capacitive pair of elements and both of the first element of the first capacitive pair of elements and the oscillator unit, and the second coupling capacitor between the fourth element of the second capacitive pair of elements and both the second element of the first capacitive pair of elements and the reference potential.

2. The frequency modulator as claimed in claim 1, wherein at least one of the two serially connected capacity elements of the first capacitive pair of elements, at least one of the two capacity elements of the second capacitive pair of elements, or the at least one of the two serially connected capacity elements of the first capacitive pair of elements and the at least one of the two capacity elements of the second capacitive pair of elements are formed by capacity diodes.

3. The frequency modulator as claimed in claim 2, wherein both of the two serially connected capacity elements of the first capacitive pair of elements are respectively formed by a capacity diode,
   wherein the two serially connected capacity diodes of the first capacitive pair of elements are reverse-connected to each other, and
   wherein both of the two capacity elements of the second capacitive pair of elements are formed by respective capacity diodes that are reverse-connected to each other and are connected to the oscillator unit with a reverse polarity to the capacity diodes of the first capacitive pair of elements.

4. The frequency modulator as claimed in claim 1, wherein the two serially connected capacity elements of the first capacitive pair of elements and the two capacity elements of the second capacitive pair of elements are components of the same type.

5. The frequency modulator as claimed in claim 4, wherein the components comprise diodes.

6. The frequency modulator as claimed in claim 1, wherein the first capacitive pair of elements is coupled to the second capacitive pair of elements via at least one coupling capacitor.

7. The frequency modulator as claimed in claim 1, further comprising a supply device operable to provide a bias voltage to individual capacity elements of the two serially connected capacity elements of the first capacitive pair of elements, to individual capacity elements of the two capacity elements of the second capacitive pair of elements, or to a combination thereof.

8. The frequency modulator as claimed in claim 7, wherein the two capacity elements of the second capacitive pair of elements are configured as capacity diodes that are connected to the second node via anodes, and the supply device is configured to supply an electrical bias potential to cathodes of the capacity diodes, the third element of the second capacitive pair of elements coupled to the supply device via a first resistor at a node between the third element of the second capacitive pair of elements and the first coupling capacitor, and the fourth element of the second capacitive pair of elements coupled to the supply device via a second resistor at a node between the fourth element of the second capacitive pair of elements and the second coupling capacitor.

9. The frequency modulator as claimed in claim 7, wherein the supply device is configured to supply an electrical input potential at the first modulator input and at the second modulator input.

10. The frequency modulator as claimed in claim 9, wherein the electrical bias potential is twice as high as the electrical input potential.

11. A magnetic resonance tomography system comprising:
    a frequency modulator for providing a communication signal that is frequency-modulated, the frequency modulator comprising:
       a first modulator input for a first modulation signal for specification of a frequency modulation for the communication signal;
       a second modulator input for reception of a second modulation signal symmetrical to the first modulation signal;
       an oscillator unit coupled with the first modulator input, the oscillator unit comprising an LC-oscillating circuit configured, dependent on the first modulation signal and the second modulation signal, to generate the frequency-modulated communication signal at an oscillator output;
       a first capacitive pair of elements with two serially connected capacity elements, a first element of the first capacitive pair of elements being coupled to the oscillator unit and a second element of the first capacitive pair of elements being coupled to a reference potential, wherein a first node between the two serially connected capacity elements is coupled to the first modulator input so that the first modulation signal is suppliable at the first node; and
       a second capacitive pair of elements connected in parallel to the first capacitive pair of elements, the second capacitive pair of elements comprising two capacity elements serially connected to each other, a third element of the second capacitive pair of elements being coupled to the oscillator unit and a fourth element of the second capacitive pair of elements being coupled to the reference potential, wherein a second node between the two capacity elements of the second capacitive pair of elements is coupled to the second modulator input, so that the second modulation signal is suppliable at the second node.

12. The magnetic resonance tomography system as claimed in claim 11, wherein at least one of the two serially connected capacity elements of the first capacitive pair of elements, at least one of the two capacity elements of the second capacitive pair of elements, or the at least one of the two serially connected capacity elements of the first capacitive pair of elements and the at least one of the two capacity elements of the second capacitive pair of elements are formed by capacity diodes.

13. The magnetic resonance tomography system as claimed in claim 12, wherein both of the two serially connected capacity elements of the first capacitive pair of elements are respectively formed by a capacity diode,
    wherein the two serially connected capacity diodes of the first capacitive pair of elements are reverse-connected to each other, and
    wherein both of the two capacity elements of the second capacitive pair of elements are formed by respective capacity diodes that are reverse-connected to each other and are connected to the oscillator unit with a reverse polarity to the capacity diodes of the first capacitive pair of elements.

14. The magnetic resonance tomography system as claimed in claim 11, wherein the two serially connected capacity elements of the first capacitive pair of elements and the two capacity elements of the second capacitive pair of elements are components of the same type.

15. The magnetic resonance tomography system as claimed in claim 14, wherein the components comprise diodes.

16. The magnetic resonance tomography system as claimed in claim 11, wherein the first capacitive pair of elements is coupled to the second capacitive pair of elements via at least one coupling capacitor.

17. The magnetic resonance tomography system as claimed in claim 11, wherein the frequency modulator further comprises a supply device operable to provide a bias voltage to individual capacity elements of the two serially connected capacity elements of the first capacitive pair of elements, to individual capacity elements of the two capacity elements of the second capacitive pair of elements, or to a combination thereof.

18. The magnetic resonance tomography system as claimed in claim 17, wherein the two capacity elements of the second capacitive pair of elements are configured as capacity diodes that are connected to the second node via anodes, and the supply device is configured to supply an electrical bias potential to cathodes of the capacity diodes.

19. The magnetic resonance tomography system as claimed in claim 17, wherein the supply device is configured to supply an electrical input potential at the first modulator input and at the second modulator input.

20. The magnetic resonance tomography system as claimed in claim 19, wherein the electrical bias potential is twice as high as the electrical input potential.

21. The frequency modulator as claimed in claim 1, wherein the first element of the first capacitive pair of elements and the third element of the second capacitive pair of elements are coupled to the oscillator unit via a single node.

* * * * *